United States Patent
Li et al.

(10) Patent No.: US 12,401,873 B2
(45) Date of Patent: Aug. 26, 2025

(54) CAMERA MODULE AND ELECTRONIC DEVICE

(71) Applicant: VIVO MOBILE COMMUNICATION CO., LTD., Guangdong (CN)

(72) Inventors: Huacong Li, Chang'an Dongguan (CN); Yunfa He, Chang'an Dongguan (CN); Ze Yang, Chang'an Dongguan (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 157 days.

(21) Appl. No.: 18/340,010

(22) Filed: Jun. 22, 2023

(65) Prior Publication Data

US 2023/0336857 A1    Oct. 19, 2023

Related U.S. Application Data

(63) Continuation of application No. PCT/CN2021/138635, filed on Dec. 16, 2021.

(51) Int. Cl.
*H04N 23/54* (2023.01)
*H04N 23/55* (2023.01)
(Continued)

(52) U.S. Cl.
CPC .............. *H04N 23/54* (2023.01); *H04N 23/55* (2023.01); *H04N 23/57* (2023.01);
(Continued)

(58) Field of Classification Search
CPC ........ H04N 23/54; H04N 23/55; H04N 23/57; H04N 23/687; H04N 23/51; H04N 23/685;
(Continued)

(56) References Cited

U.S. PATENT DOCUMENTS

2006/0269262 A1* 11/2006 Shin .................. G03B 5/02
                                                    348/E5.046
2007/0104044 A1*  5/2007 Kim .................. G11B 7/0932
                       (Continued)

FOREIGN PATENT DOCUMENTS

| CN | 103200360 A | 7/2013 |
| CN | 105573014 A | 5/2016 |

(Continued)

OTHER PUBLICATIONS

International Search Report and Written Opinion of the International Searching Authority dated Mar. 1, 2022 as received in Application No. PCT/CN2021/138635.

*Primary Examiner* — Abdelaaziz Tissire
(74) *Attorney, Agent, or Firm* — Price Heneveld LLP

(57) ABSTRACT

A camera module is disclosed and includes: a housing, internally provided with an accommodation cavity; a lens assembly, movably arranged in the accommodation cavity; a circuit board, connected to lens assembly; and a gimbal assembly, including: a support plate, where at least part of the support plate is movably arranged in the accommodation cavity, and the lens assembly and the circuit board are arranged on the support plate; a first driving assembly, where the first driving assembly is arranged on the housing, and at least part of the first driving assembly is connected to the support plate to drive the support plate to move in a first direction; and a second driving assembly, where the second driving assembly is arranged on the support plate, and at least part of the second driving assembly is connected to the support plate to drive the support plate to move in a second direction.

18 Claims, 4 Drawing Sheets

(51) Int. Cl.
  *H04N 23/57*      (2023.01)
  *H04N 23/68*      (2023.01)
  *H05K 1/18*       (2006.01)

(52) U.S. Cl.
  CPC ............ *H04N 23/687* (2023.01); *H05K 1/189*
         (2013.01); *H05K 2201/10121* (2013.01)

(58) Field of Classification Search
  CPC ......... H05K 1/189; H05K 2201/10121; H05K
         1/0277; G02B 27/646; G02B 7/04–105;
         H04M 1/0264; G03B 2205/0053–0084;
         G03B 7/10; G03B 13/36
  See application file for complete search history.

(56)         References Cited

U.S. PATENT DOCUMENTS

| | | | |
|---|---|---|---|
| 2012/0140326 A1* | 6/2012 | Takeda | H04N 23/687 |
| | | | 359/554 |
| 2012/0281517 A1* | 11/2012 | Lee | G11B 7/0933 |
| 2013/0163974 A1* | 6/2013 | Takei | G03B 5/00 |
| | | | 396/55 |
| 2013/0177301 A1 | 7/2013 | Nakayama et al. | |
| 2015/0055220 A1* | 2/2015 | Lim | G02B 27/646 |
| | | | 359/557 |
| 2017/0324892 A1* | 11/2017 | Kim | H04N 23/55 |
| 2017/0339346 A1 | 11/2017 | Chung et al. | |
| 2017/0353662 A1 | 12/2017 | Enta | |
| 2017/0363881 A1 | 12/2017 | Stec | |
| 2018/0173080 A1* | 6/2018 | Enta | H04N 23/57 |
| 2018/0348594 A1 | 12/2018 | Shin et al. | |
| 2020/0174271 A1* | 6/2020 | Minamisawa | G03B 5/00 |
| 2020/0174272 A1* | 6/2020 | Minamisawa | G03B 5/04 |
| 2020/0310150 A1 | 10/2020 | Minamisawa | |
| 2020/0371374 A1* | 11/2020 | Barak | G03B 17/02 |
| 2021/0215900 A1 | 7/2021 | Sue et al. | |
| 2021/0278689 A1* | 9/2021 | Kasahara | H02K 41/0356 |
| 2023/0336853 A1* | 10/2023 | Li | H04N 23/54 |
| 2023/0336855 A1* | 10/2023 | Li | G03B 17/12 |

FOREIGN PATENT DOCUMENTS

| | | |
|---|---|---|
| CN | 111474804 A | 7/2020 |
| CN | 111953881 A | 11/2020 |
| CN | 211880480 U | 11/2020 |
| CN | 112637471 A | 4/2021 |
| JP | 2006259247 A | 9/2006 |
| JP | 2007312325 A | 11/2007 |
| JP | 2016122055 A | 7/2016 |
| JP | 2020024260 A | 2/2020 |
| JP | 2020166020 A | 10/2020 |

* cited by examiner

CAMERA MODULE AND ELECTRONIC DEVICE

CROSS-REFERENCE TO RELATED APPLICATIONS

This application is a continuation application of PCT International Application No. PCT/CN2021/138635 filed on Dec. 16, 2021, which claims priority to Chinese Patent Application No. 202011542405.X filed on Dec. 23, 2020, which are incorporated herein by reference in their entireties.

TECHNICAL FIELD

This application belongs to the technical field of cameras, and specifically relates to a camera module and an electronic device.

BACKGROUND

The wider application of cameras on electronic devices, especially mobile phones, makes cameras a popular selling point for mobile phones. During photographing and image recording, jitters caused by a hand or movement of a user blur the image and greatly lower the imaging quality. In the 5G era, video creating and sharing will usher in a new round of explosion, and requirements of people on video shooting devices are becoming higher. This requires electronic devices to have good image stabilization performance, compensate image offsets caused by jitters, and provide stable and clear images. Currently, the design of image stabilization gimbals has a large volume and has high requirements on the hardware architectural design of electronic devices.

SUMMARY

According to a first aspect, an embodiment of this application provides a camera module, including: a housing, internally provided with an accommodation cavity; a lens assembly, movably arranged in the accommodation cavity; a circuit board, connected to the lens assembly; and a gimbal assembly, including: a support plate, where at least part of the support plate is movably arranged in the accommodation cavity, and the lens assembly and the circuit board are arranged on the support plate; a first driving assembly, where the first driving assembly is arranged on the housing, and at least part of the first driving assembly is connected to the support plate to drive the support plate to move in a first direction; and a second driving assembly, where the second driving assembly is arranged on the support plate, and at least part of the second driving assembly is connected to the support plate to drive the support plate to move in a second direction.

According to a second aspect, an embodiment of this application provides an electronic device, including the foregoing camera module.

Additional aspects and advantages of this application are partially provided in the following description, and partially become apparent in the following description or understood through the practice of this application.

BRIEF DESCRIPTION OF THE DRAWINGS

The foregoing and/or additional aspects and advantages of this application become apparent and comprehensible in the description of the embodiments made with reference to the following accompanying drawings.

Figure 1:
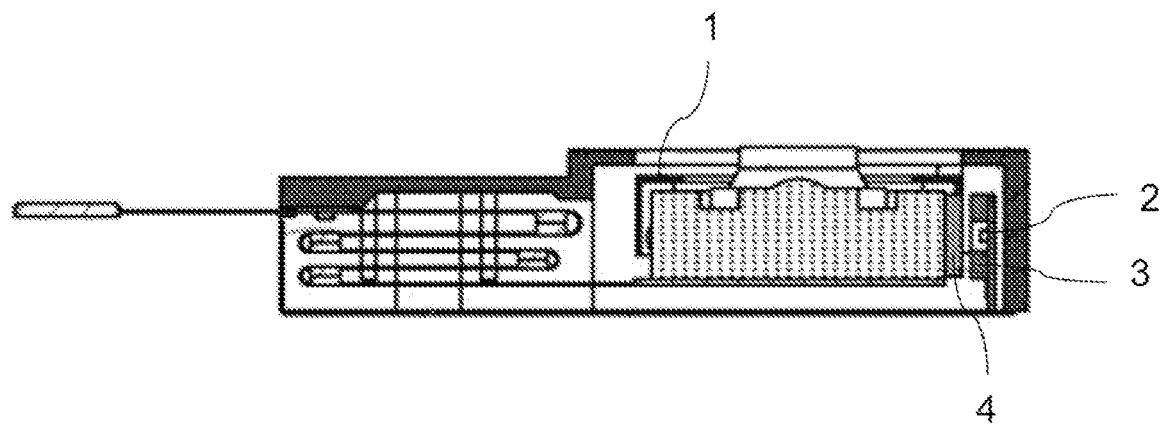
FIG. 1 is a cross-sectional view of an image stabilization gimbal in the related art.
Figure 2:
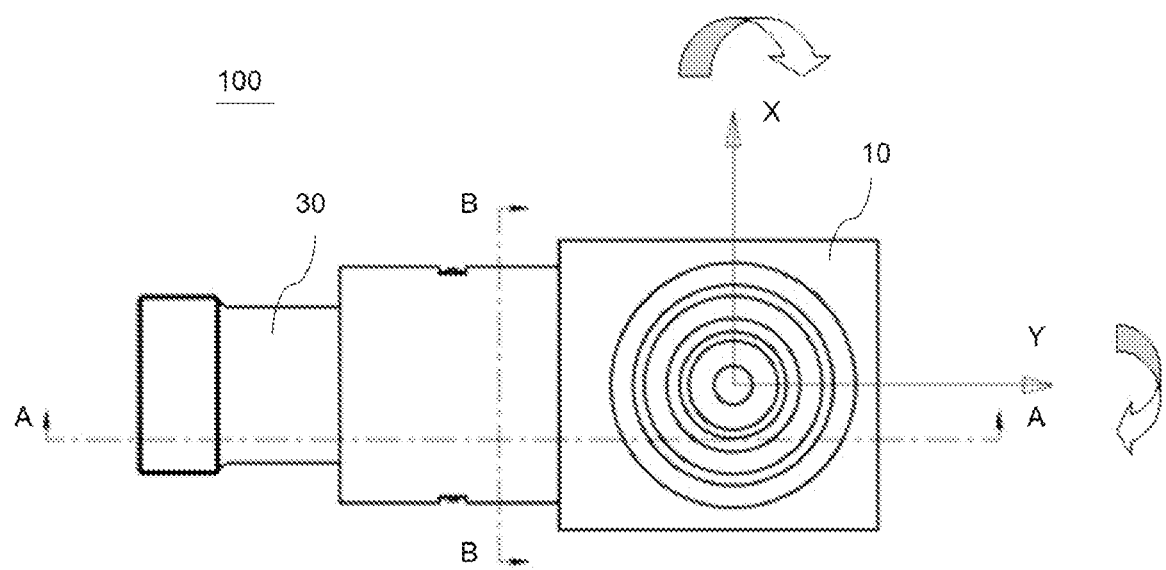
FIG. 2 is a top view of a camera module according to an embodiment of this application.

REFERENCE NUMERALS camera module 100;
housing 10; accommodation cavity 11; holder 12; cover plate 13;
lens assembly 20;
circuit board 30; first board body 31; second board body 32;
support plate 40; main board 41; side plate 42;
first driving assembly 50; first magnetic member 51; first coil 52; coil 521;
second driving assembly 60; second magnetic member 61; second coil 62;
flexible printed circuit board receiving portion 70;
first position feedback element 80;
cross support shaft 1; Hall sensing element 2; coil 3; and magnet 4.

DETAILED DESCRIPTION

Embodiments of this application are described in detail below, and examples of the embodiments are shown in accompanying drawings, where the same or similar elements or the elements having same or similar functions are denoted by the same or similar reference numerals throughout the description. The embodiments that are described with reference to the accompanying drawings are exemplary, and are only used to interpret this application, instead limiting this application. All other embodiments obtained by a person of ordinary skill in the art based on the embodiments of this application without creative efforts shall fall within the protection scope of this application.

In the specification and claims of this application, a feature defined to be "first" or "second" may explicitly or implicitly include one or more features. In the description of this application, unless otherwise stated, the meaning of "a plurality of" is two or more than two. In addition, in this specification and the claims, "and/or" represents at least one of the connected objects, and the character "/" generally indicates an "or" relationship between the associated objects.

In the description of this application, it should be understood that, orientations or position relationships indicated by terms such as "center", "longitudinal", "transverse", "length", "width", "thickness", "up", "down", "front", "back", "left", "right", "vertical", "horizontal", "top", "bottom", "inner", "outer", "clockwise", "counterclockwise", "axial", "radial", and "circumferential" are orientations or position relationship shown based on the accompanying drawings, and are merely used for describing this application and simplifying the description, rather than indicating or implying that the apparatus or element should have a particular orientation or be constructed and operated in a particular orientation, and therefore, should not be construed as a limitation on this application.

In the description of this application, it should be noted that, unless explicitly specified or limited otherwise, the terms "mount", "interconnect", and "connect" should be understood broadly, for example, the connection may be fixed connection, detachable connection, or integral connection; or the connection may be a mechanical connection or an electrical connection; or the connection may be a direct connection, an indirect connection through an intermediary, or internal communication between two components. A person of ordinary skill in the art may understand the specific meanings of the foregoing terms in this application according to specific situations.

This application is an invention by the creator based on the following facts.

FIG. 1 shows an image stabilization gimbal in the related art.

As shown in FIG. 1, a camera module in the image stabilization gimbal according to the related art uses a dangling structure. Through the cooperation of a cross support shaft 1 with a connected diagonal line, an electromagnetic driving system, and a Hall sensing element 2, the camera module is driven to move and the position is fed back, so as to achieve the objective of image stabilization on the module. The electromagnetic driving system includes a coil 3 and a magnet 4 cooperating with each other.

As can be seen from FIG. 1, a camera body is embedded in the gimbal, and the electromagnetic driving system is arranged at the outside of the camera body. To be specific, the dangling system and the driving system peculiar to the gimbal result in a large size of the overall gimbal, and lead to big troubles for structure stacking and design of the camera module.

Based on this, the inventor of this application creatively obtained the following invention through long-term research and experiments.

A camera module 100 according to an embodiment of this application includes: a housing 10, a lens assembly 20, a circuit board 30, and a gimbal assembly. The gimbal assembly includes: a support plate 40, a first driving assembly 50, and a second driving assembly 60.

Specifically, the housing 10 is internally provided with an accommodation cavity 11, and the lens assembly 20 is movably arranged in the accommodation cavity 11. The circuit board 30 and the lens assembly 20 are connected to each other. The support plate 40 is at least partially movably arranged in the accommodation cavity 11, and the lens assembly 20 and the circuit board 30 are arranged on the support plate 40. The first driving assembly 50 is arranged in the housing 10, and at least part of the first driving assembly is connected to the support plate 40 to drive the support plate 40 to move in a first direction. The second driving assembly 60 is arranged on the support plate 40, and at least part of the second driving assembly is connected to the support plate 40 to drive the support plate 40 to move in a second direction.

In other words, the camera module 100 according to this embodiment of this application mainly includes a housing 10, a lens assembly 20 mounted in the housing 10, a circuit board 30 electrically connected to the lens assembly 20, and a gimbal assembly. The gimbal assembly mainly includes a support plate 40 that can limit the lens assembly 20 and the circuit board 30, and a first driving assembly 50 and a second driving assembly 60 that can drive the support plate 40. The housing 10 is a basic component of the camera module 100, can provide a basis for mounting other components of the camera module 100, and protects the parts or components such as the driving assembly. In this embodiment of this application, the housing 10 has an accommodation cavity 11 that can accommodate the lens assembly 20.

In the specific process of photographing, the camera module 100 may incline due to jittering, and eventually affect the photographing quality. In the camera module 100 disclosed in this embodiment of this application, the lens assembly 20 is movable relative to the housing 10. The first driving assembly 50 and the second driving assembly 60 drive the lens assembly 20 to move, so as to compensate an inclination caused by jittering of the camera module 100, thereby implementing effective image stabilization on the camera module 100.

In this embodiment of this application, the lens assembly 20 and the circuit board 30 can move synchronously with the support plate 40, and the support plate 40 may serve as a reinforcement plate. Therefore, when the first driving assembly 50 and the second driving assembly 60 drive the support plate 40 to move, the lens assembly 20 and the circuit board 30 can move simultaneously, so as to prevent the lens assembly 20 from moving relative to the circuit board 30 and dragging the circuit board 30.

Compared with the solution that the electromagnetic driving system directly drives the camera body in the related art, in the camera module 100 according to this embodiment of this application, the first driving assembly 50 and the second driving assembly 60 indirectly drive the lens assembly 20 and the circuit board 30 through the support plate 40. In this way, the circuit board 30 and the lens assembly 20 can move synchronously, which prevents a flexible printed circuit board from dragging the camera body in the related art, and the lens assembly 20 according to this embodiment of this application can move farther and rotate through a larger angle. In addition, the defect that the volume of the overall structure of the camera module is large because the electromagnetic driving system is mounted on the camera body in the related art is avoided.

It should be noted that, the first driving assembly 50 can drive the support plate 40 to move in the first direction, and the second driving assembly 60 can drive the support plate 40 to move in the second direction, and the first direction and the second direction may be the same direction or reverse directions, or intersect with each other. This is not limited herein. The first driving assembly 50 and the second driving assembly 60 may simultaneously or independently operate. This is not limited herein. Types of movement of the support plate 40 in the first direction and/or the second direction include moving and rotation types. This is not limited herein either. Through the cooperation of the first driving assembly 50 and the second driving assembly 60, the support plate 40 is enabled to move in a larger space range, thereby expanding movement ranges of the lens assembly 20 and the circuit board 30.

Besides, any one of the first driving assembly 50 and the second driving assembly 60 includes, but is not limited to, a motor, or may be another driving structure that can enable the support plate 40 to move, such as a driving motor, including a driving motor, a transmission mechanism cooperating with the driving motor, and the like.

Therefore, in the camera module 100 according to this embodiment of this application, the support plate 40 is connected to the lens assembly 20 and the circuit board 30 respectively, and the first driving assembly 50 and the second driving assembly 60 cooperate with each other to drive the support plate 40 to move in the first direction and the second direction. When the support plate 40 moves, the support plate 40 can drive the lens assembly 20 and the circuit board 30 to move synchronously, which can prevent the lens assembly 20 from dragging the circuit board 30 during moving, reduce a volume of the overall structure of the camera module 100, improve the flexibility of the support plate 40, and expand the movement range of the support plate 40.

According to an embodiment of this application, the housing 10 includes: a holder 12 and a cover plate 13. The holder 12 is provided with an accommodation cavity 11 with an opening on a first side, the lens assembly 20 may be arranged in the accommodation cavity 11 and is movable relative to the holder 12, and the circuit board 30 may be connected to the lens assembly 20 through the opening. The cover plate 13 is arranged on the first side of the holder 12, and the first driving assembly 50 is arranged on the cover plate 13. Optionally, a part of the first driving assembly 50 may be arranged on the cover plate 13, and another part of the first driving assembly 50 may be arranged on the support plate 40 and is movable relative to the cover plate 13.

In some specific implementations of this application, the support plate 40 includes: a main board 41 and a side plate 42. The lens assembly 20 and the circuit board 30 are arranged on a first side of the main board 41, the first driving assembly 50 is at least partially located on a second side of the main board 41. The side plate 42 is arranged on the first side of the main board 41, and the second driving assembly 60 is arranged on the side plate 42. In other words, the support plate 40 is divided into the main board 41 and the side plate 42, to facilitate mounting of the first driving assembly 50 and the second driving assembly 60.

According to an embodiment of this application, the main board 41 and the side plate 42 are approximately perpendicular to each other.

For ease of description, it is defined in the following that the camera module 100 is assembled in an up-down direction, a direction close to a viewer is a front side, and a direction away from the viewer is a rear side.

The main board 41 is approximately a rectangular plate and extends in a front-rear direction. A straight line parallel to a length direction of the main board 41 is referred to as a Y axis, a straight line parallel to a width direction of the main board 41 is referred to as an X axis, and a straight line perpendicular to a plane in which the main board 41 is located is referred to as a Z axis. Each part or component of the camera module 100 may be assembled approximately in the Z-axis direction.

Figure 3:
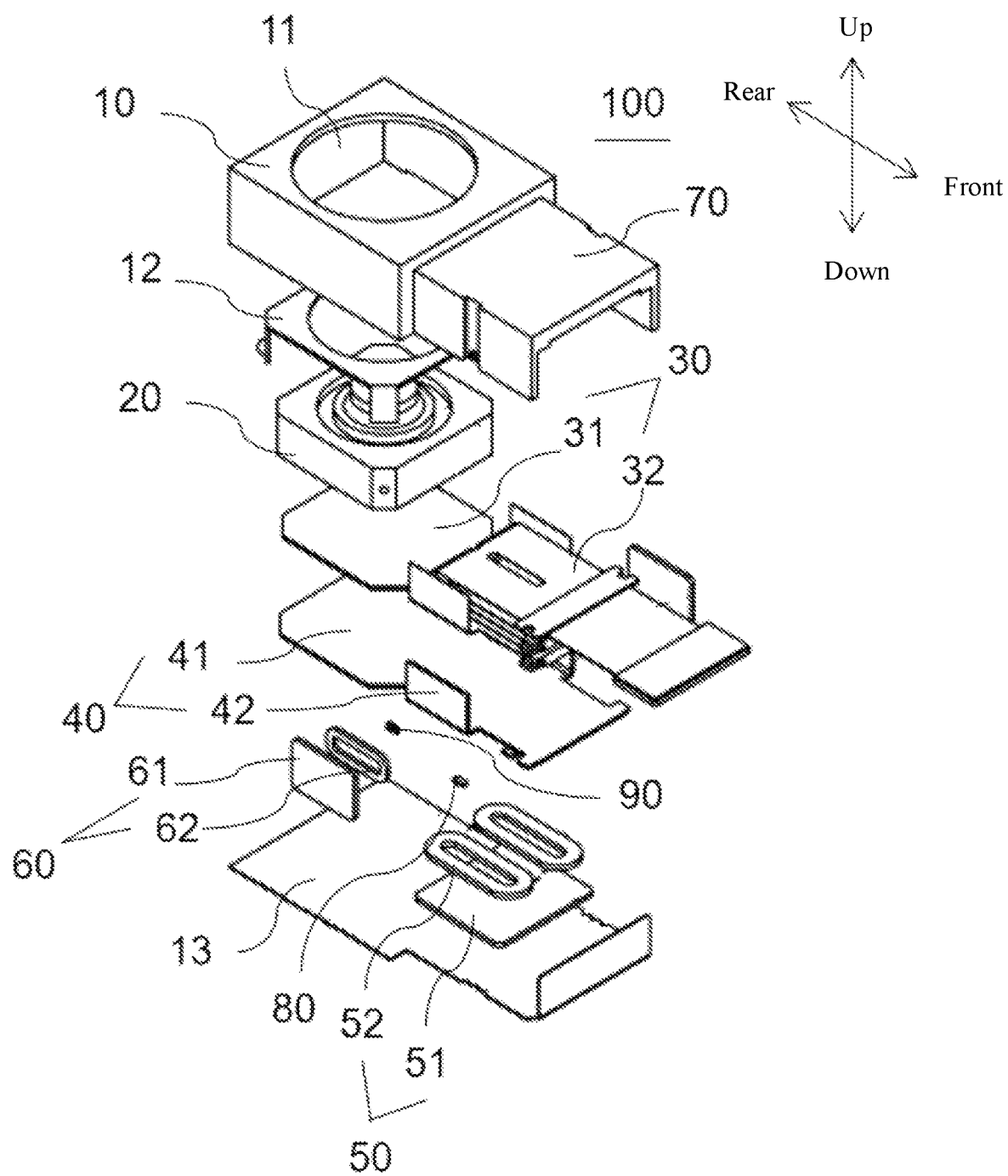
FIG. 3 is a partial exploded view of a camera module according to an embodiment of this application.

As shown in FIG. 3, the lens assembly 20 and the circuit board 30 are located above the main board 41, and the side plate 42 is located above the main board 41. A lower end of the side plate 42 is connected to a length side of the main board 41, and an upper end of the side plate 42 extends upward in the Z axis. The arrangement of the first driving assembly 50 on the main board 41 can enable the support plate 40 to rotate around the X-axis or Y-axis direction. The arrangement of the second driving assembly 60 on the side plate 42 can enable the support plate 40 to rotate around the X-axis or Y-axis direction.

It should be noted that, the foregoing definitions of up, down, the front side, the rear side, the X axis, the Y axis, and the Z axis are merely for ease of description of position relationships or connection relationships of the components of the camera module 100 according to the embodiments of this application, and do not constitute any limitation on the embodiments of this application.

In addition, for the same parts and components in the embodiments of this application, only one of the parts or components in the figures may be marked with a reference numeral, and the reference numeral is also applicable to the other same parts or components.

Further, the circuit board 30 includes: a first board body 31 and a second board body 32. The first board body 31 is arranged between the lens assembly 20 and the main board 41, the lens assembly 20 is arranged on a first side of the first board body 31, and a second side of the first board body 31 is connected to the first side of the main board 41. The second board body 32 is arranged on the first side of the main board 41, and is electrically connected to the first board body 31. The second board body 32 may be a flexible printed circuit board, a conducting wire, or the like. As shown in FIG. 3, the first board body 31 is located behind the second board body 32 and under the lens assembly 20. When the circuit board 30 and the main board 41 are assembled, lower sides of the first board body 31 and the second board body 32 may be respectively connected to an upper side of the main board 41. Dividing the circuit board 30 into the first board body 31 and the second board body 32 is conducive to the connection between the circuit board 30 and the lens assembly 20 and the movement of the lens assembly 20 while implementing synchronous movement of the circuit board 30 and the main board 41.

Optionally, the first board body 31 is a printed circuit board, and the second board body 32 is a flexible printed circuit board. During assembly, the second board body 32 may be folded along an S shape. When the lens assembly 20 moves, the second board body 32 can synchronously expand and contract, thereby expanding the movement range of the lens assembly 20. Further, the second board body 32 and the first driving assembly 50 are arranged opposite to each other, and the second driving assembly 60 is arranged at a periphery of the second board body 32. In this way, the space below and at the periphery of the second board body 32 can be fully used, and the defect that the size of the overall structure of the camera module 100 is large because the first driving assembly 50 and the second driving assembly 60 are placed below the lens assembly 20 is avoided.

Further, in a case that the housing 10 further includes a flexible printed circuit board receiving portion 70, as shown in FIG. 3, the flexible printed circuit board receiving portion 70 may be located in front of the holder 12. The second board body 32, the first driving assembly 50, and the second driving assembly 60 may all be located in the flexible printed circuit board receiving portion 70, thereby fully using the receiving space of the flexible printed circuit board receiving portion.

According to an embodiment of this application, a shape of the first board body 31 corresponds to a shape of a surface of a first side of the lens assembly 20, and a shape of the main board 41 corresponds to shapes of the first board body 31 and the second board body 32. This improves the stability and reliability of the overall structure when the lens assembly 20 and the circuit board 30 move.

Figure 5:
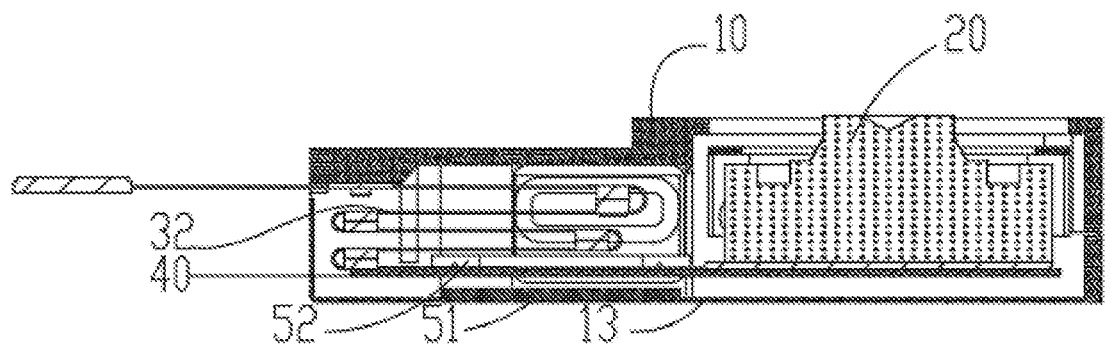
FIG. 5 is a cross-sectional view along A-A in FIG. 2.

In some specific implementations of this application, the first driving assembly 50 includes: a first magnetic member 51 and a first coil 52. One of the first magnetic member 51 and the first coil 52 is connected to the cover plate 13, and the other of the first magnetic member 51 and the first coil 52 is connected to the main board 41. After being energized, the first coil 52 is movable relative to the first magnetic member 51 to drive the main board 41. In other words, the first magnetic member 51 may be arranged on the cover plate 13, and the first coil 52 may be arranged on the main board 41; or the first magnetic member 51 may be arranged on the support plate 40, and the first coil 52 may be arranged on the cover plate 13. For example, as shown in FIG. 5, the first magnetic member 51 is connected to an upper end surface of the cover plate 13. The first coil 52 is connected to an upper end surface of the main board 41 and a lower end surface of the second board body 32, and cooperates with the first magnetic member 51.

It should be noted that, in a case that the first driving assembly 50 includes the first magnetic member 51 and the first coil 52, the support plate 40 may be of a non-magnetically conductive rigid material. When the first driving assembly 50 operates, the first magnetic member 51 and the first coil 52 cooperate with each other. According to Fleming's left-hand rule, a force perpendicular to a magnetic field direction is generated in the energized first coil 52, and the main board 41 can be controlled to move when the force acts on the main board 41.

Further, the first magnetic member 51 has a plate-shaped structure, and is attached onto the cover plate 13. In other words, the first magnetic member 51 may be a flat coil, and can effectively save space. The first magnetic member 51 is attached onto the cover plate 13, thereby facilitating the assembly of the first magnetic member 51. It should be noted that, the first magnetic member 51 may be mounted on the cover plate 13 in another mounting manner, for example, clamping, insertion, or another detachable mounting manner.

In this embodiment of this application, the first coil 52 are two annular coils 521 that are spaced apart on the main board 41. In a case that there are more than two coils 521, the balance of forces can be effectively ensured.

Figure 4:
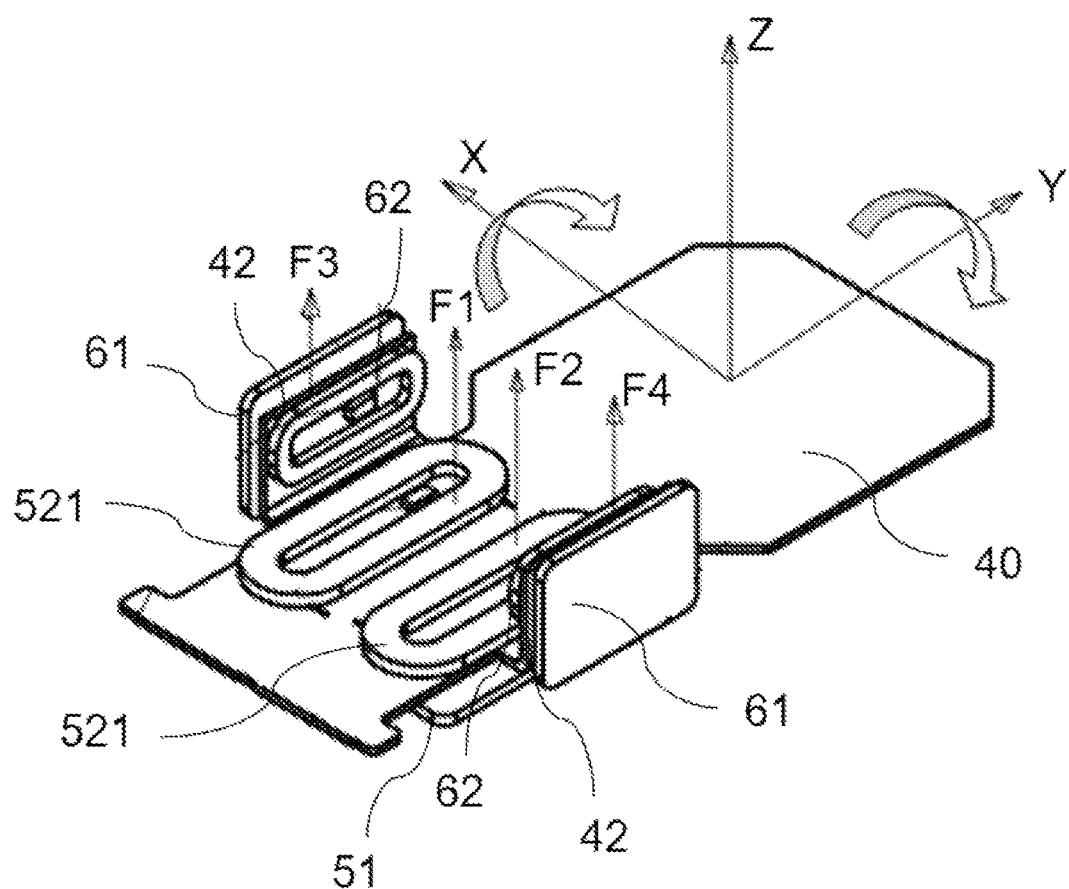
FIG. 4 is a schematic diagram of assembly of a first driving assembly, a second driving assembly, and a support plate of a camera module according to an embodiment of this application.

Referring to FIG. 4, for example, the two annular coils 521 may respectively be a first annular coil and a second annular coil, and the first annular coil and the second annular coil may share a magnet. The main board 41 may rotate around a direction by controlling energization situations of the first annular coil and the second annular coil.

In this embodiment of this application, the second board body 32 is a folded S-shaped flexible board, and the lower end surface of the second board body 32 is approximately a rectangular component. Length sides of the second board body 32 extend in the Y-axis direction, width sides of the second board body 32 extend in the X-axis direction, and the second board body 32 may be folded approximately in the Z-axis direction.

The first annular coil and the second annular coil are located on the lower end surface of the second board body 32, and are spaced apart in a length direction of the second board body 32. The first annular coil and the second annular coil both are an elliptical component that extends approximately in a width direction of the second board body 32. In a case that forces generated on the first annular coil and the second annular coil are the same, the support plate 40 rotates around the X-axis direction. In a case that the forces generated on the first annular coil and the second annular coil are different, the support plate 40 rotates around the Y axis. In a case that the first annular coil and the second annular coil both are turned on, the balance of forces can be ensured.

According to an embodiment of this application, the camera module 100 further includes a first position feedback element 80. A movement position of the main board 41 can be fed back through the first position feedback element 80. The first position feedback element 80 may be a Hall chip, or the like. This is not limited herein.

Optionally, in a case that the coil 521 is an annular coil, the first position feedback element 80 may be mounted on a hollow structure of the annular coil, thereby saving space.

In some specific implementations of this application, there are two side plates 42. The two side plates 42 are arranged opposite to each other on the first side of the main board 41, and each side plate 42 is provided with one second driving assembly 60. In a case that the main board 41 is in a strip shape, the two side plates 42 may be spaced apart in the width direction of the main board 41, and each side plate 42 extends in the length direction of the main board 41.

Figure 6:
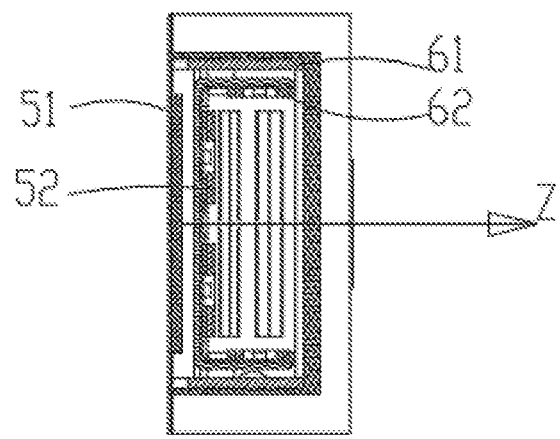
FIG. 6 is a cross-sectional view along B-B in FIG. 2.

Further, the second driving assembly 60 includes: a second magnetic member 61 and a second coil 62. One of the second magnetic member 61 and the second coil 62 is connected to the side plate 42, and the other of the second magnetic member 61 and the second coil 62 is connected to the housing 10. After being energized, the second coil 62 is movable relative to the second magnetic member 61 to drive the side plate 42. In other words, the second magnetic member 61 may be arranged on the side plate 42, and the second coil 62 may be arranged on the housing 10; or the second magnetic member 61 may be arranged on the housing 10, and the second coil 62 may be arranged on the side plate 42. For example, as shown in FIG. 6, the second magnetic member 61 is arranged on an inner side wall of the housing 10, and the second coil 62 is arranged on a side of the side plate 42 adjacent to the second board body 32, and cooperates with the second magnetic member 61.

After being energized, the second coil 62 is movable relative to the second magnetic member 61 to drive the second board body 32. A cooperation principle of the second magnetic member 61 and the second coil 62 is the same as a cooperation principle of the first magnetic member 51 and the first coil 52. This is not described herein again.

According to an embodiment of this application, the camera module 100 further includes a second position feedback element 90. A movement position of the side plate 42 can be fed back through the second position feedback element 90. The second position feedback element 90 may be a Hall chip, or the like. This is not limited herein.

Optionally, in a case that the second coil 62 is an annular coil, the second position feedback element 90 may be mounted on a hollow structure of the annular coil, thereby saving space.

It should be noted that, the first driving assembly 50 and the second driving assembly 60 may operate independently, or may operate cooperatively. In a case that the first driving assembly 50 and the second driving assembly 60 cooperate with each other, the support plate 40 can rotate around the X axis and the support plate 40 can rotate around the Y axis.

For example, as shown in FIG. 4, it is set that the first coil 52 is subjected to forces F1 and F2 and the second coil 62 is subjected to forces F3 and F4. In a case that directions of F1, F2, F3, and F4 are the same, the support plate 40 is driven to move, so that the support plate 40 rotates around the X axis. In a case that the directions of F1 and F3 are the same, F1 and F3 are combined into one group that is represented by [F1, F3]; and in a case that the directions of F2 and F4 are the same, F2 and F4 are combined into one group that is represented by [F2, F4]. In a case that the directions of [F1, F3] and [F2, F4] are reverse, the support plate 40 is driven to rotate around the Y axis.

Optionally, the second magnetic member 61 has a plate-shaped structure, and is attached onto the side plate 42. This has advantages of facilitating assembly and saving the mounting space.

An embodiment of this application further provides an electronic device, including the camera module 100 according to any one of the foregoing embodiments. The lens assembly 20 may be electrically connected to the main board 41 of the electronic device through the circuit board 30, to supply power to the lens assembly 20.

The electronic device according to this embodiment of this application may be a smart phone, a tablet computer, a wearable device, or the like. This is not limited herein.

In the descriptions of this specification, descriptions using reference terms "an embodiment", "some embodiments", "an exemplary embodiment", "an example", "a specific example", or "some examples" mean that specific characteristics, structures, materials, or features described with reference to the embodiment or example are included in at least one embodiment or example of this application. In this specification, schematic descriptions of the foregoing terms do not necessarily point at a same embodiment or example. Moreover, the specific features, structures, materials, or characteristics described may be combined in any one or more embodiments or examples in an appropriate manner.

Although the embodiments of this application have been shown and described, a person of ordinary skill in the art should understand that various changes, modifications, replacements and variations may be made to the embodiments without departing from the principles and spirit of this application, and the scope of this application is as defined by the appended claims and their equivalents.

What is claimed is:

1. A camera module, comprising:
  a housing, internally provided with an accommodation cavity;
  a lens assembly, movably arranged in the accommodation cavity;
  a circuit board, connected to the lens assembly; and
  a gimbal assembly, comprising:
  a support plate, wherein at least part of the support plate is movably arranged in the accommodation cavity, and the lens assembly and the circuit board are arranged on the support plate;
  a first driving assembly, wherein the first driving assembly is arranged on the housing, and at least part of the first driving assembly is connected to the support plate to drive the support plate to move in a first direction; and
  a second driving assembly, wherein the second driving assembly is arranged on the support plate, and at least part of the second driving assembly is connected to the support plate to drive the support plate to move in a second direction;
  wherein the support plate comprises:
  a main board, wherein the lens assembly and the circuit board are arranged on a first side of the main board, and the first driving assembly is at least partially located on a second side of the main board; and
  a side plate, wherein the side plate is arranged on the first side of the main board, and the second driving assembly is arranged on the side plate.

2. The camera module according to claim 1, wherein the housing comprises:
  a holder, provided with the accommodation cavity with an opening on a first side; and
  a cover plate, wherein the cover plate is arranged on the first side of the holder, and the first driving assembly is arranged on the cover plate.

3. The camera module according to claim 1, wherein the circuit board comprises:
  a first board body, wherein the first board body is arranged between the lens assembly and the main board, the lens assembly is arranged on a first side of the first board body, and a second side of the first board body is connected to the first side of the main board; and
  a second board body, wherein the second board body is arranged on the first side of the main board, and the second board body and the first board body are electrically connected to each other.

4. The camera module according to claim 3, wherein the first board body is a printed circuit board, and the second board body is a flexible printed circuit board.

5. The camera module according to claim 4, wherein a shape of the first board body corresponds to a shape of a surface of a first side of the lens assembly, and a shape of the main board corresponds to shapes of the first board body and the second board body.

6. The camera module according to claim 3, wherein two side plates are provided, the two side plates are arranged opposite to each other on the first side of the main board, and each of the side plates is provided with one second driving assembly.

7. The camera module according to claim 6, wherein the second driving assembly comprises: a second magnetic member and a second coil, wherein one of the second magnetic member and the second coil is connected to the side plate, the other of the second magnetic member and the second coil is connected to the second board body, and after being energized, the second coil is movable relative to the second magnetic member to drive the second board body.

8. The camera module according to claim 7, wherein the second magnetic member has a plate-shaped structure and is attached onto the side plate.

9. The camera module according to claim 1, wherein the first driving assembly comprises a first magnetic member and a first coil, one of the first magnetic member and the first coil is connected to the cover plate, and the other of the first magnetic member and the first coil is connected to the main board, and after being energized, the first coil is movable relative to the first magnetic member to drive the main board.

10. The camera module according to claim 9, wherein the first magnetic member has a plate-shaped structure, and is attached onto the cover plate.

11. An electronic device, comprising a camera module; wherein the camera module comprises:
  a housing, internally provided with an accommodation cavity;
  a lens assembly, movably arranged in the accommodation cavity;
  a circuit board, connected to the lens assembly; and
  a gimbal assembly, comprising:
  a support plate, wherein at least part of the support plate is movably arranged in the accommodation cavity, and the lens assembly and the circuit board are arranged on the support plate;
  a first driving assembly, wherein the first driving assembly is arranged on the housing, and at least part of the first driving assembly is connected to the support plate to drive the support plate to move in a first direction; and
  a second driving assembly, wherein the second driving assembly is arranged on the support plate, and at least part of the second driving assembly is connected to the support plate to drive the support plate to move in a second direction;
  wherein the support plate comprises:

a main board, wherein the lens assembly and the circuit board are arranged on a first side of the main board, and the first driving assembly is at least partially located on a second side of the main board; and a side plate, wherein the side plate is arranged on the first side of the main board, and the second driving assembly is arranged on the side plate.

12. The electronic device according to claim 11, wherein the housing comprises:

a holder, provided with the accommodation cavity with an opening on a first side; and a cover plate, wherein the cover plate is arranged on the first side of the holder, and the first driving assembly is arranged on the cover plate.

13. The electronic device according to claim 11, wherein the circuit board comprises:

a first board body, wherein the first board body is arranged between the lens assembly and the main board, the lens assembly is arranged on a first side of the first board body, and a second side of the first board body is connected to the first side of the main board; and a second board body, wherein the second board body is arranged on the first side of the main board, and the second board body and the first board body are electrically connected to each other.

14. The electronic device according to claim 13, wherein the first board body is a printed circuit board, and the second board body is a flexible printed circuit board.

15. The electronic device according to claim 14, wherein a shape of the first board body corresponds to a shape of a surface of a first side of the lens assembly, and a shape of the main board corresponds to shapes of the first board body and the second board body.

16. The electronic device according to claim 13, wherein two side plates are provided, the two side plates are arranged opposite to each other on the first side of the main board, and each of the side plates is provided with one second driving assembly.

17. The electronic device according to claim 11, wherein the first driving assembly comprises a first magnetic member and a first coil, one of the first magnetic member and the first coil is connected to the cover plate, and the other of the first magnetic member and the first coil is connected to the main board, and after being energized, the first coil is movable relative to the first magnetic member to drive the main board.

18. The electronic device according to claim 17, wherein the first magnetic member has a plate-shaped structure, and is attached onto the cover plate.

* * * * *